United States Patent
Girardeau, Jr.

[11] Patent Number: 5,598,448
[45] Date of Patent: Jan. 28, 1997

[54] METHOD AND APPARATUS FOR CONTROLLING A DIGITAL PHASE LOCK LOOP AND WITHIN A CORDLESS TELEPHONE

[75] Inventor: James W. Girardeau, Jr., Austin, Tex.

[73] Assignee: Motorola Inc., Schaumburg, Ill.

[21] Appl. No.: 399,005

[22] Filed: Mar. 6, 1995

[51] Int. Cl.$^6$ ........................................... H03D 3/24
[52] U.S. Cl. ..................... 375/376; 331/25; 327/105
[58] Field of Search .................... 375/373, 375, 375/376; 331/1 R, 1 A, 14, 17, 18, 25, 34, DIG. 2; 327/155, 156, 157, 158, 159, 160, 161, 105

[56] References Cited

U.S. PATENT DOCUMENTS

| | | |
|---|---|---|
| 4,506,233 | 3/1985 | Englund, Jr. ........................ 331/17 |
| 4,758,801 | 7/1988 | Draxelmayr ........................ 331/8 |
| 4,931,748 | 6/1990 | McDermott et al. ............... 331/1 A |
| 5,220,294 | 6/1993 | Ichikawa ............................ 331/17 |
| 5,347,233 | 9/1994 | Ishibashi et al. .................. 331/2 |
| 5,436,937 | 7/1995 | Brown et al. ...................... 375/376 |

*Primary Examiner*—Wellington Chin
*Assistant Examiner*—Paul Loomis

[57] ABSTRACT

A digital phase lock loop controller (DPLL) (10) incorporates an adjustment generator (34) for continually adjusting the sensitivity of the DPLL (10) to reduce injected noise. The DPLL also comprises an error detector (16), a frequency adjuster (22), a first oscillation generator (28), and a divider (32) that function in a manner common to many DPLLs (10). However, the adjustment generator (34) continually adjusts the operation of the frequency adjuster (22) based upon the relative phase difference between a reference oscillation (12) and a feedback oscillation (14) in order to vary the sensitivity of the DPLL (10). When the reference oscillation (12) and the feedback oscillation (14) are relatively in phase, the sensitivity of the DPLL (10) is low. Oppositely, when the reference oscillation (12) and the feedback oscillation (14) move out of phase, the sensitivity of the DPLL (10) increases.

3 Claims, 4 Drawing Sheets

5,598,448

METHOD AND APPARATUS FOR CONTROLLING A DIGITAL PHASE LOCK LOOP AND WITHIN A CORDLESS TELEPHONE

TECHNICAL FIELD OF THE INVENTION

This invention relates generally to signal processing systems and more particularly to the control of digital phase locked loops employed within the signal processing systems.

BACKGROUND OF THE INVENTION

Digital phase lock loops (DPLLs) are commonly used to create oscillatory signals in phase with, but at frequency multiples or divisors of, reference oscillations. Sigma-Delta analog to digital (A/D) converters commonly use DPLLs to generate the high frequency sampling oscillations used in the conversion process.

Another application of a DPLL is in a digital phone system wherein digital transmissions are sent from a base unit and received by a portable unit. On a periodic basis, the base unit transmits data frames to the portable unit. From the data frame, a radio frequency transceiver within the portable unit constructs a reference oscillation from the data frames. The reference oscillation provides a basis for a communication processor in the portable unit to receive digital data and also to transmit digital data that is synchronized to the base unit. The communication processor converts the digital data to analog data that is conveyed to a user and also receives analog data from a user, converts the data to a digital format, and transmits the data to the base unit in a synchronized fashion. To ensure proper synchronization, the communication processor requires a high frequency sampling signal that is in phase with the reference oscillation, thus it incorporates a DPLL.

The DPLL located in the portable unit creates the sampling signal that the communication processor uses to synchronize with the reference oscillation. The DPLL typically includes a phase detector, a loop filter, and a digital oscillator. In operation, the digital oscillator constructs a first oscillation from a fixed frequency clock. Typically, the fixed frequency clock is of a frequency on the order of 10 MHz and the first oscillation is of a frequency on the order of 1 MHz. The first oscillation is then provided as an input to the divider which creates both a feedback oscillation and a sampling signal that is used by other circuitry in the system. The digital oscillator and divider are designed such that the frequency of the feedback oscillation is of the same frequency as the reference oscillation. Thus, not accounting for drift and variations in the frequencies of the signals, the reference and feedback oscillations are of an identical frequency and the control function of the DPLL is to force the feedback oscillation in phase with the reference oscillation. In this manner, the sampling signal will also be in phase with the reference oscillation.

However, due to inaccuracies in crystal oscillators of the reference oscillation clock and the fixed frequency clock, the design frequency of the DPLL usually varies from the frequency of the reference oscillation. Over time, the frequency differences of the signals appears as phase shifts between the reference and feedback oscillations. Thus, a control function of the DPLL is to shift the feedback oscillation so as to force it in phase with the reference oscillation. This is accomplished with the phase detector which compares the feedback oscillation created by the DPLL to the incoming reference oscillation. If the reference oscillation precedes the feedback oscillation in time, the phase detector outputs a late signal. If the feedback oscillation precedes the reference oscillation in time, the phase detector outputs an early signal. The early signal provides a count-up signal to a counter of the loop filter and the late signal provides a countdown signal to the counter. When the count goes above a positive count threshold, the loop filter issues a retard signal to the digital oscillator. Alternatively, when the count goes below a negative count threshold, the loop filter issues an advance signal to the digital oscillator.

The digital oscillator, which includes a counter and a decoder, outputs the first oscillation when the counter reaches a certain count. When the digital oscillator receives an advance signal, the first oscillation is produced upon a lower count. Alternatively, when the digital oscillator receives a retard signal, the first oscillation is produced upon a higher count. Thus, a rising edge of the first oscillation is shifted with respect to a previous rising edge of the first oscillation so that the phase of the first oscillation is closer to the phase of the reference oscillation.

While shifting the first oscillation causes it to be in phase with the reference oscillation, the sampling signal also is shifted with respect to the reference oscillation. This shift of the sampling signal appears as noise in the sampling signal and resultantly causes noise in the coupled circuitry. Without filtering in the control of the DPLL, shifts in the sampling signal occur often and the sampling signal has significant "jitter". Resultantly, significant noise may be introduced into the sampling process.

Therefore, a need exists for a controlling circuit that reduces the injected noise in DPLLs when frequency corrections are being made.

DESCRIPTION OF A PREFERRED EMBODIMENT

Generally, the present invention provides an apparatus and method for controlling a digital phase lock loop (DPLL) to reduce noise in a sampling signal produced by the DPLL. More specifically, the present invention includes bandwidth adjustment circuitry and method of operation of circuitry that varies the sensitivity of the DPLL depending upon the operation of the DPLL. The present invention allows the DPLL to operate responsively during transient conditions and less so during steady state operation such that injected noise is reduced.

Figure 1:
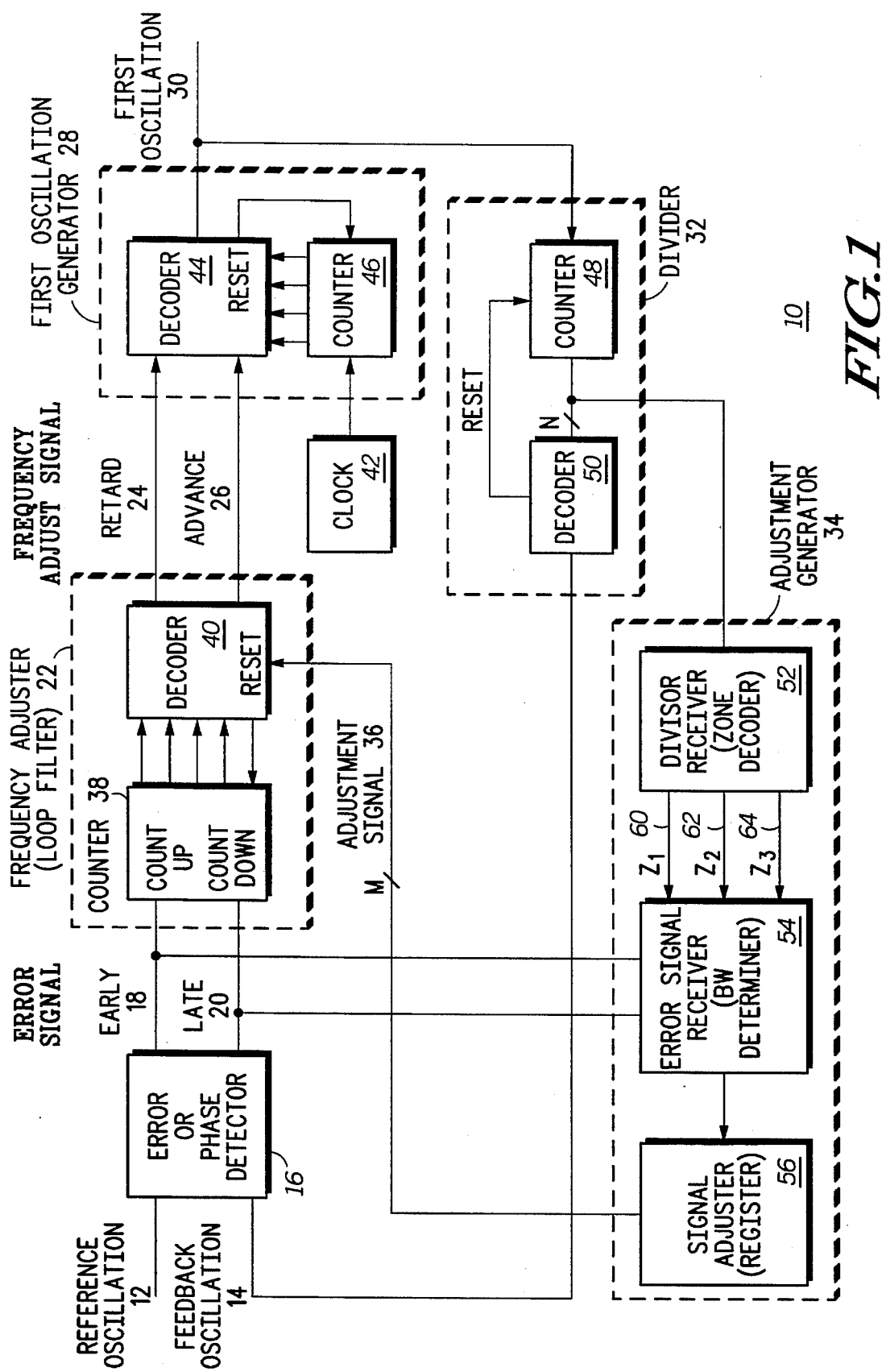
FIG. 1 illustrates a block diagram of a digital phase lock loop and phase lock loop controller in accordance with the present invention.

FIG. 1 illustrates a block diagram of a digital phase lock loop (DPLL) 10 incorporating a phase lock loop controller. The DPLL 10 comprises a phase detector 16, a frequency adjuster (or loop filter) 22, a first oscillation generator 28, a divider 32, and an adjustment generator 34.

The phase detector 16 compares a reference oscillation 12 to a feedback oscillation 14. When the feedback oscillation 14 precedes the reference oscillation 12 in time, the phase detector oscillator 16 produces an early error signal 18. When the reference oscillation 12 precedes the feedback oscillation 14, the feedback oscillator produces a late error signal 20. The early or late error signal 18 or 20 is provided to the frequency adjuster 22.

In addition to receiving the early or late signal 18 or 20, the frequency adjuster 22 receives an adjusting signal 36 from the adjustment generator 34. The function of the frequency adjuster 22 is to selectively control the DPLL 10 so as to force the feedback oscillation 14 into phase with the reference oscillation. Preferably, the frequency adjuster 22 comprises a counter 38 and a decoder 40. The counter 38 receives the early error signal 18 as a count up signal and the late error signal 20 as a count down signal. The counter 38 therefore counts in both a positive direction and a negative direction.

The decoder 40 receives as its input the count from the counter 38 and the adjusting signal 36 and outputs two frequency adjust signals, retard 24 and advance 26. The adjusting signal 36 provides the count limit to the decoder 40 and effectively controls the sensitivity of the frequency adjuster 22. When the decoder 40 senses that the counter has counted up to an upper count limit, it issues a retard 24 frequency adjust signal to the first oscillation generator 28 and resets the counter 38. When the decoder 40 senses that the counter 38 has counted down to a lower count limit, the decoder 40 transmits an advance 26 frequency adjust signal to the first oscillation generator 28 and resets the counter 38.

The first oscillation generator 28 constructs a first oscillation 30 from a fixed frequency clock 42 and comprises a decoder 44 and a counter 46. The first oscillation 30 is used by an additional circuit (not shown) to construct a sampling signal that may be used for A/D conversion and for sampling digital signals that may be coupled to the reference oscillation 12. The decoder 44 receives both the retard 24 frequency adjust signal and the advance 26 frequency adjust signal from the frequency adjuster 22. The counter 46 receives as its input the fixed frequency clock 42. The counter 46 counts up to a count limit contained in the decoder 44. When the counter 46 reaches the count limit, the decoder 44 resets the counter 46 and outputs a rising edge clock of the first oscillation 30. Based on the retard 24 and advance 26 frequency adjust signals, the first oscillation generator 28 phase shifts the first oscillation 30 in an attempt to force the feedback oscillation 14 into phase with the reference oscillation.

The divider 32 preferably comprises a counter 48 and a decoder 50. The counter 48 receives as its input the first oscillation 30 and counts up to a count limit. When the counter reaches the count limit, the decoder 50 resets the counter 48. The count limit of the decoder 50 is fixed and selected so as, during steady state operation, the frequency of the feedback oscillation 14 matches exactly the frequency of the reference oscillation 12. The output of the counter 48 has a width of N bits and also serves as an input to the adjustment generator 34.

Figure 4:
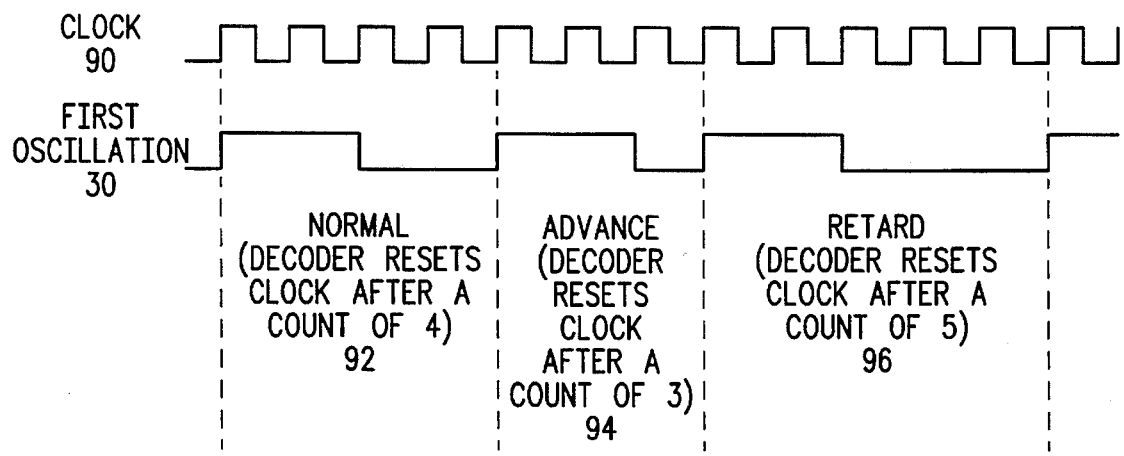
FIG. 4 illustrates clock and oscillatory signals during normal, advance, and retard operations of the digital phase lock loop controller in accordance with the present invention.

FIG. 4 illustrates the fixed frequency clock 42 output 90 and the first oscillation 30 during a normal cycle 92, an advance cycle 94, and retard cycle 96 of the operation of the first oscillation generator 28. During a normal cycle 92, the decoder 44 resets the counter 46 after a count of four and the period of the first oscillation 30 is four times the period of the fixed frequency clock 42 output 90. When the first oscillation generator 28 receives an advance 26 frequency adjust signal during an advance cycle 94, the decoder 44 resets the counter 46 after a count of three and the period of the first oscillation 30 is three times the period of the fixed frequency clock 42 output 90. Finally, when the first oscillation generator 28 receives a retard 24 frequency adjust signal during an advance cycle 96, the decoder 44 resets the counter 46 after a count of five and the period of the first oscillation 30 is five times the period of the fixed frequency clock 42 output 90. Phase adjustment of the first oscillation 30 in this manner is also known in the art and are the cause for injected noise.

Referring again to FIG. 1, when the feedback oscillation 14 consistently lags the reference oscillation 12 such that enough late 20 error signals are received by the counter 38 so that the count of the counter 38 goes below the negative count limit, an advance 26 error signal will be produced. Then, the first oscillation 30 will be advanced by one cycle of the fixed frequency clock 42. Resultantly, the feedback oscillation 14 will also be advanced by one cycle of the fixed frequency clock 42. Conversely, when the feedback oscillation 14 consistently leads the reference oscillation such that enough early 18 error signals are received by the counter 38 so that the count of the counter 38 goes above the positive count limit, a retard 24 error signal will be produced. Then, the first oscillation 30 will be delayed by one cycle of the fixed frequency clock 42. Resultantly, the feedback oscillation 14 will also be retarded by one cycle of the fixed frequency clock 42.

The adjustment generator 34 receives as its input the early 18 error signal, the late 20 error signal, and the counter 48 output. The adjustment generator 34 comprises a divisor receiver (zone decoder) 52, an error signal receiver (band width determiner) 54, and a signal adjuster 56. The divisor receiver 52 receives the counter 48 output and creates a representation of the divisor used by the divider 32. In operation, the adjustment generator 34 continually monitors the DPLL 10 and alters the adjusting signal 36 to adjust the sensitivity of the frequency adjuster 22 to thereby reduce injected noise.

Figure 2:
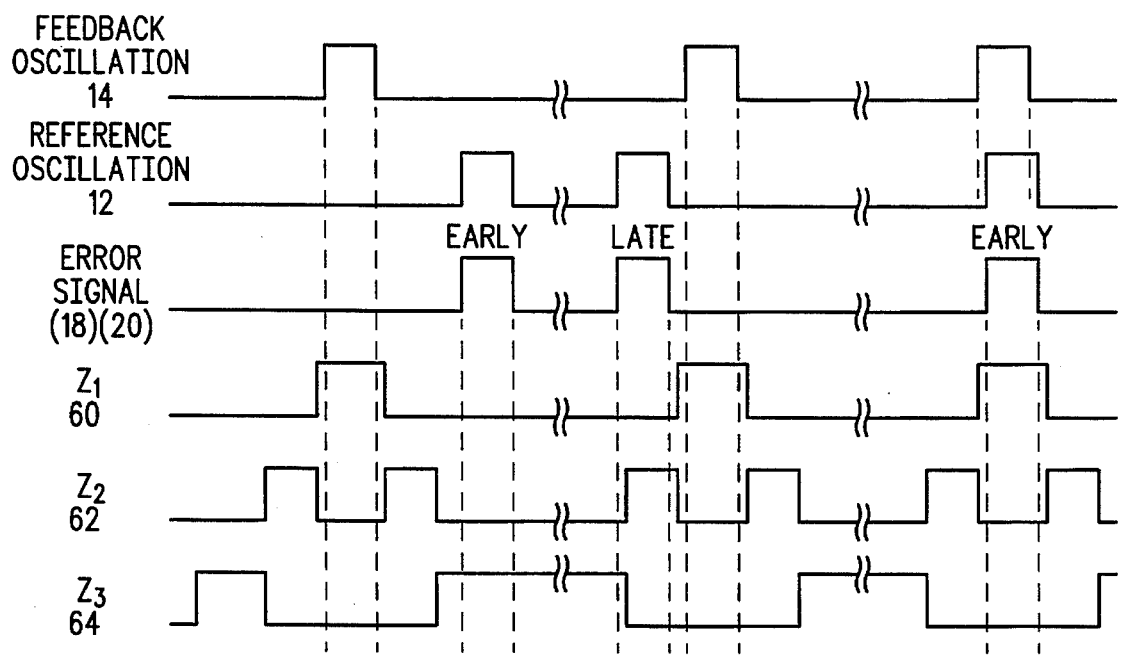
FIG. 2 illustrates oscillatory, error, and control signals of the digital phase lock loop controller in accordance with the present invention.

Referring to both FIG. 1 and FIG. 2, the divisor receiver 52 constructs a representation of the divisor of the divider 32, the representation preferably appearing as three zone signals, $Z_1$ 60, $Z_2$ 62, and $Z_3$ 64. The error signal receiver 54 then compares the zone signals $Z_1$ 60, $Z_2$ 62, and $Z_3$ 64 to either the early 18 or late 20 error signal, as shown in FIG. 2, in order to determine how far out of phase the feedback oscillation 14 is with the reference oscillation. Zone signal $Z_1$ 60 is logic high over a period centered around feedback oscillation 14 and, if early 18 or late 20 lies within an active high portion of $Z_1$, the reference oscillation 12 is either in phase, or nearly in phase, with the feedback oscillation 14. Zone signal $Z_2$ 62 is logic high at two periods adjacent to the $Z_1$ 60 signal and if early 18 or late 20 lies within an active high portion of $Z_2$, the reference oscillation 12 is slightly out of phase with the feedback oscillation 14. Zone signal $Z_3$ 64 is logic high at two periods adjacent to the active portions of $Z_1$ 60 and $Z_2$ 62 and, if early 18 or late 20 lies within an active high portion of $Z_3$ 64, the reference oscillation 12 is greatly out of phase with the feedback oscillation 14. Thus, for each cycle of the feedback oscillation 14 and reference oscillation 12, the divisor receiver 52 constructs the zone signals $Z_1$ 60, $Z_2$ 62, and $Z_3$ 64 and the error signal receiver 54 compares the error signal, either early 18 or late 20, to the zone signals to determine in which zone the error signal lies.

Figure 3:
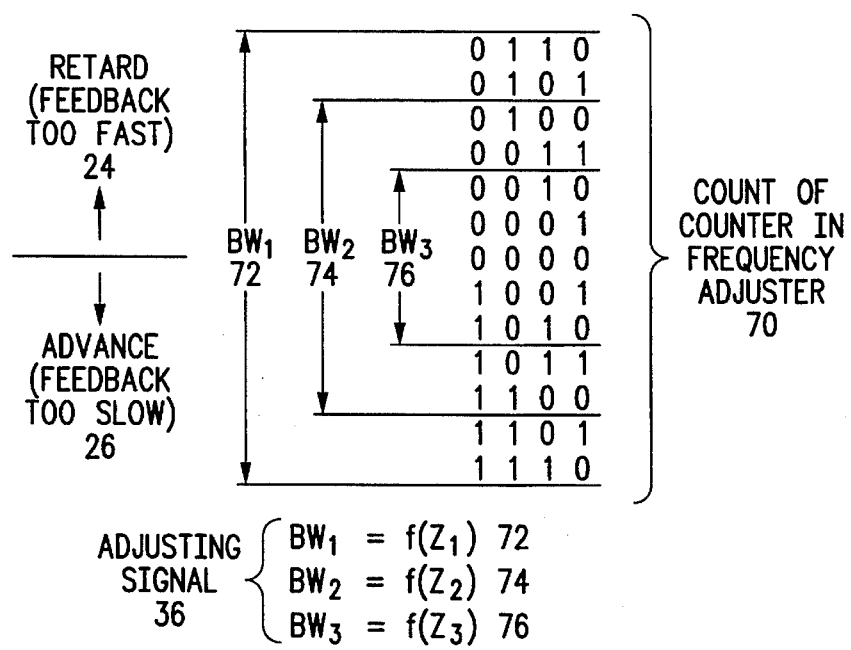
FIG. 3 illustrates a bandwidth control logic of the digital phase lock loop controller in accordance with the present invention.

Based upon the zone in which the error signal lies, the error signal receiver 54 directs the signal adjuster 56 to select an appropriate adjusting signal 36. FIG. 3 relates the zone signals $Z_1$ 60, $Z_2$ 62, and $Z_3$ 64 to their respective adjusting signals 36. Zone signals $Z_1$ 60, $Z_2$ 62, and $Z_3$ 64 correspond to bandwidths $BW_1$ 72, $BW_2$ 74, and $BW_3$ 76. Preferably, the bandwidth signal selected becomes the adjusting signal 36 and sets both the upper and lower count limit 70 of the counter 38 in the frequency adjuster 22. As is shown, $BW_1$ 72 is wider than both $BW_2$ 74 and $BW_3$ 76 while $BW_2$ 74 is wider than $BW_3$ 76. Therefore, the count limit 70 of the frequency adjuster 22 is larger in magnitude for $BW_1$ than for either $BW_2$ or $BW_3$ and larger in magnitude for $BW_2$ than $BW_3$.

The sensitivity of the DPLL 10 increases inversely with the count limit 70 of the frequency adjuster 22. Therefore, because the bandwidth becomes larger as the feedback oscillation 14 is nearly in phase with the reference oscillation 12, the sensitivity of the DPLL 10 decreases. Conversely, as the feedback oscillation 14 moves further away from being in phase with the reference oscillation 12, the sensitivity of the DPLL 10 increases. In this fashion, when the DPLL 10 is seeking to lock the feedback oscillation 14 to the reference oscillation 12, the DPLL 10 has a greater sensitivity and reacts more quickly. However, when the DPLL 10 has reached a frequency and phase lock state, its sensitivity is reduced, and the receipt of successive early error signals 18 or late error signals 20 will not cause the first oscillation 30 to shift until a large number of such have been received in succession. The present invention therefore provides a continually varying sensitivity of control for the DPLL 10 which reduces injected noise in first oscillation 30 and resultantly the sampling oscillation. The present invention also increases the ability of the DPLL 10 to track the reference oscillation 12 during transient conditions which helps performance.

As one skilled in the art will readily appreciate, more than three zones could be created with each zone having a respective bandwidth. Thus, in this fashion, the sensitivity of the DPLL 10 could be customized for particular applications. For example, where noise is more or less prevalent in the reference oscillation, it may be beneficial to adjust the sensitivity of the DPLL 10 accordingly. As one skilled in the art will also appreciate, other factors may be used in selecting the variable sensitivity of the DPLL 10.

Figure 5:
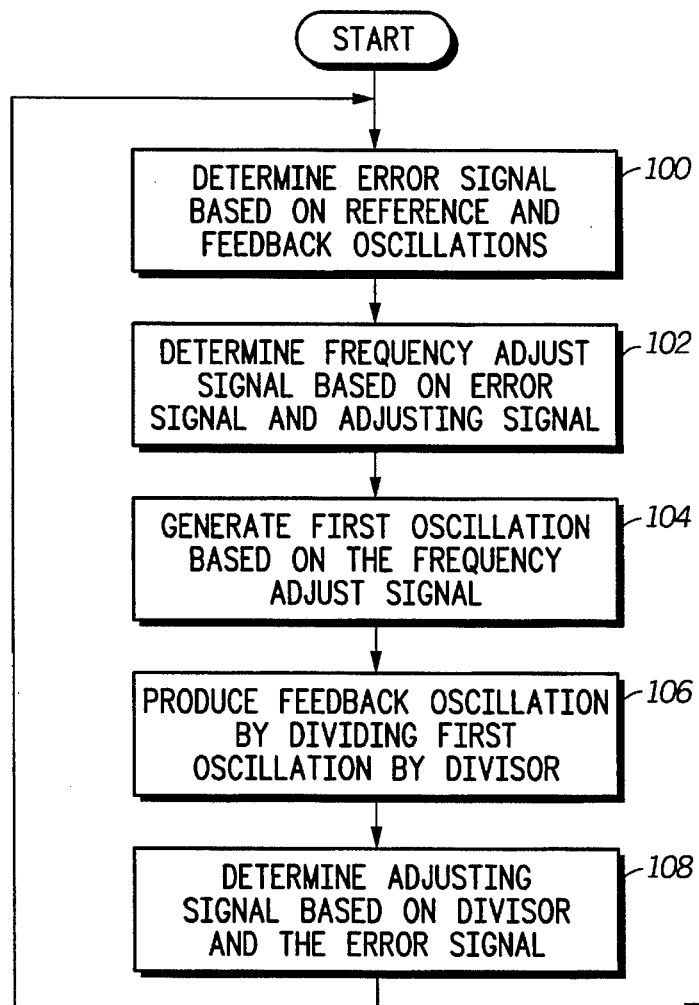
FIG. 5 illustrates a logic diagram of a method of the present invention for controlling a digital phase lock loop.

With reference to FIG. 1 and also to FIG. 5, the method of DPLL is described. At block 100 an error signal is determined based on a difference between a reference oscillation 12 and a feedback oscillation 14. At block 102, the method includes determining a frequency adjust signal 36, retard 24 or advance 26, based on the error signal, early 18 or late 20, and an adjusting signal 36. The next step at block 104 includes generating a first oscillation 30 based on the frequency adjust signal 36. Next, at block 106, the method includes the step of producing the feedback oscillation 14 by dividing the first oscillation by a divisor. Finally, at block 108, the step of producing an adjusting signal 36 based on a representation of the divisor and the error signal, early 18 or late 20, to reduce the injected noise in the DPLL 10 is performed. After the step at block 108 has been completed, control of the method returns to the step at block 100.

Figure 6:
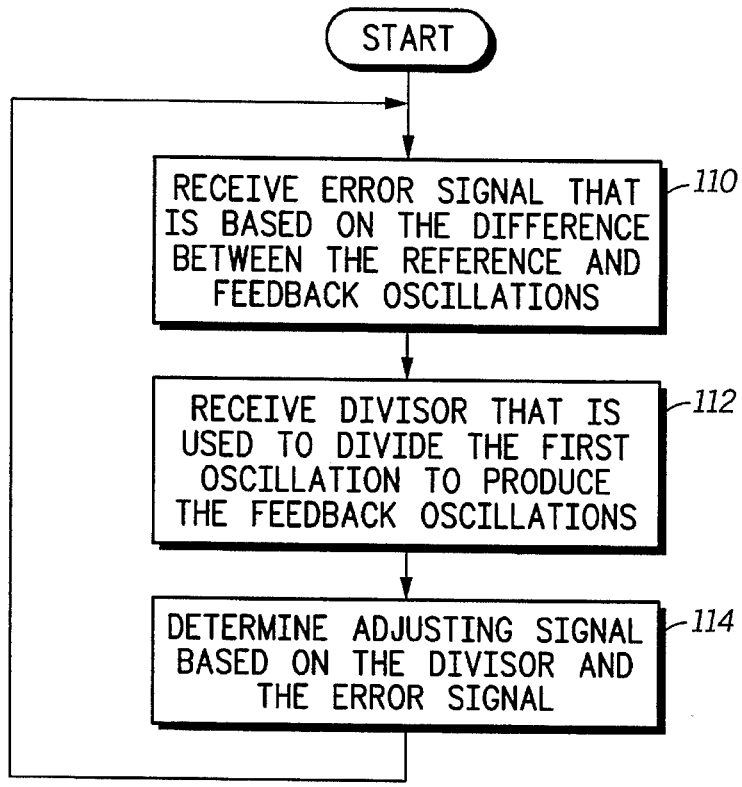
FIG. 6 illustrates a logic diagram of a method of the present invention for controlling at least a portion of a digital phase lock loop.

Referring to FIG. 6, a second method for controlling at least a portion of a DPLL 10 is described. A first step in the method at block 110 includes receiving an error signal, early 18 or late 20, wherein the error signal is based on a difference between a reference oscillation 12 and a feedback oscillation 14. Next, at block 112, the method includes receiving a representation of a divisor, wherein the divisor is used to divide the first oscillation 30 to produce the feedback oscillation 14. The method includes a final step at block 114 of determining an adjusting signal 36 based on the divisor and the error signal 18 or 20. In this step, the adjusting signal 36 adjusts the sensitivity of the DPLL 10 so that injected noise is reduced. As will be readily appreciated by one skilled in the art, by adjusting the frequency of the DPLL 10, jitter in a sampling oscillation to be used by other components attached to the DPLL 10 is reduced. Therefore, noise on the signal is reduced, thus reducing injected noise and other components of the system as well.

Figure 7:
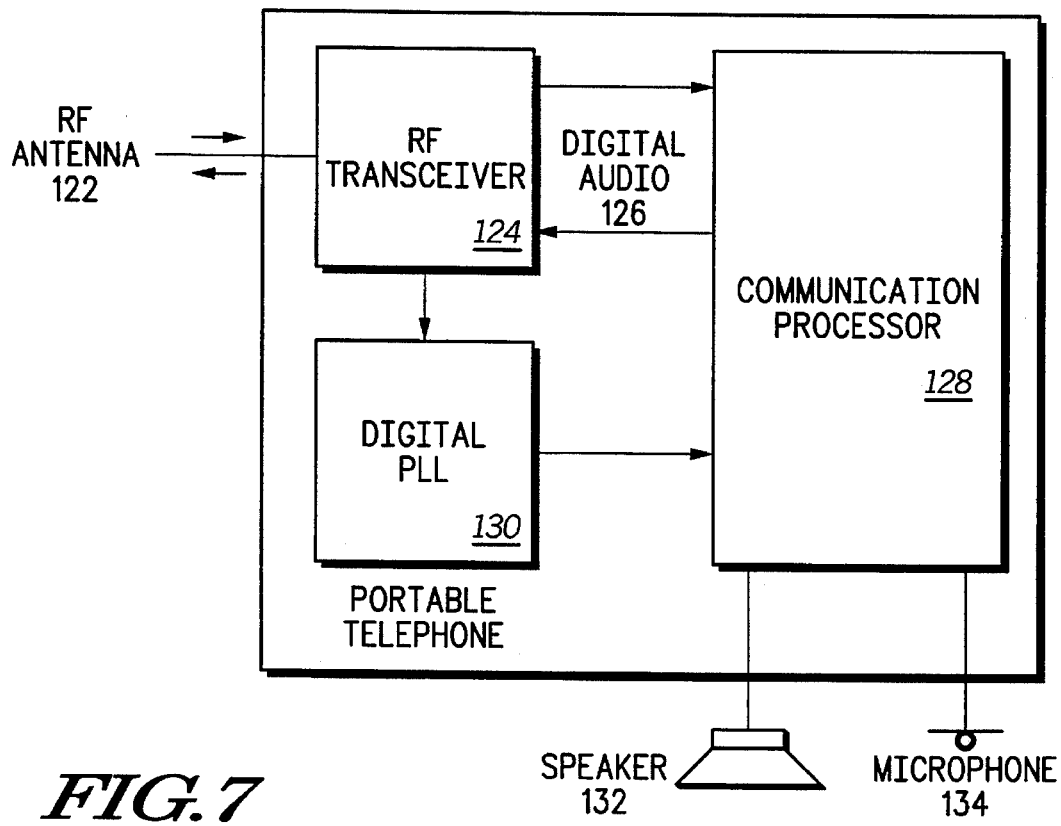
FIG. 7 illustrates a portable phone utilizing a phase lock loop circuit in accordance with the present invention.

Referring now to FIG. 7, the present invention also includes a cordless telephone that uses the teachings of the present invention. Preferably, the digital telephone comprises a radio frequency transceiver 124, a communication processor 128, and a DPLL 130 incorporating the teachings of the present invention. The radio frequency transceiver 124 receives signals and transmits signals via a radio frequency antenna 122. The radio frequency transceiver converts digital signals received in a serial format to digital audio data 126 that may be transmitted to the communication processor 128. The DPLL 130, incorporating the components of the present invention preferably includes an error detector 16, a frequency adjuster 22, a first oscillator 28, a divider 32, and an adjustment generator 34. The function of these components has already been discussed and will not be discussed again herein. The portable telephone 120 in the present invention also includes a speaker 132 and microphone 134 for transmitting audio data to a user and receiving audio data from a user. Within the portable telephone 120, the DPLL 130 provides a high sampling signal to the communication processor 128 which uses the high frequency sampling signal in its sampling and conversion functions.

The above described preferred embodiments are intended to illustrate the principles of the invention, but not to limit the scope of the invention. Various other embodiments and modifications to these preferred embodiments may be made by those skilled in the art without departing from the scope of the following claims.

I claim:

1. An apparatus for controlling a digital phase lock loop comprising:

an error detector, wherein the error detector determines an error signal based on a difference between a reference oscillation and a feedback oscillation;

a frequency adjuster having a counter for receiving the error signal, and a decoder coupled to the counter for providing a frequency adjust signal based on a count value of the counter and an adjusting signal;

a first oscillation generator, wherein the first oscillation generator generates a first oscillation based on the frequency adjust signal;

a divider, wherein the divider divides the first oscillation by a predetermined divisor to produce the feedback oscillation; and an adjustment generator for determining the adjusting signal based on the predetermined divisor and the error signal;

wherein the adjustment generator comprises:
- an error signal receiver, coupled to the error detector, for receiving the error signal;
- a divisor receiver, coupled to the divider, for receiving a predetermined divisor that is used to divide the first oscillation to produce the feedback oscillation, and providing at least two zone signals to the error signal receiver based on the predetermined divisor; and
- a signal adjuster, coupled to the error signal receiver, for providing a count limit to the decoder of the frequency adjuster, the adjusting signal, wherein the adjusting signal adjusts sensitivity of the phase lock loop such that injected noise is reduced.

2. The apparatus of claim 1 wherein the error signal comprises an early error signal and a late error signal.

3. The apparatus of claim 1 wherein the frequency adjust signal comprises a retard frequency adjust signal and an advance frequency adjust signal.

* * * * *